US012263959B2

(12) United States Patent
Muhleman

(10) Patent No.: US 12,263,959 B2
(45) Date of Patent: Apr. 1, 2025

(54) SPACE-BASED CIRCUIT-REPLACING ROBOTIC SYSTEM

(71) Applicant: Naval Information Warfare Center, Pacific, San Diego, CA (US)

(72) Inventor: Daniel H. Muhleman, El Cajon, CA (US)

(73) Assignee: The United States of America as represented by the Secretary of the Navy, Washington, DC (US)

(*) Notice: Subject to any disclaimer, the term of this patent is extended or adjusted under 35 U.S.C. 154(b) by 1315 days.

(21) Appl. No.: 16/913,364

(22) Filed: Jun. 26, 2020

(65) Prior Publication Data
US 2021/0403179 A1 Dec. 30, 2021

(51) Int. Cl.
| | |
|---|---|
| B23P 19/00 | (2006.01) |
| B23K 1/00 | (2006.01) |
| B64G 1/10 | (2006.01) |
| B64G 4/00 | (2006.01) |
| G01N 21/956 | (2006.01) |
| H01L 21/66 | (2006.01) |
| B23K 1/005 | (2006.01) |
| B23K 101/42 | (2006.01) |
| B64G 1/24 | (2006.01) |
| H01R 43/02 | (2006.01) |

(52) U.S. Cl.
CPC .......... *B64G 1/1078* (2013.01); *B23K 1/0016* (2013.01); *B64G 4/00* (2013.01); *G01N 21/95607* (2013.01); *H01L 22/20* (2013.01); *B23K 1/005* (2013.01); *B23K 2101/42* (2018.08); *B64G 1/247* (2023.08); *B64G 2004/005* (2013.01); *H01R 43/0263* (2013.01)

(58) Field of Classification Search
CPC ........... H01L 22/20; B64G 4/00; B64G 1/244; B64G 1/50; B64G 1/66; B64G 1/1078; B64G 1/247; B64G 2004/005; B23K 3/085; B23K 1/0016; B23K 1/005; B23K 2101/42; G01N 21/95607; H01R 43/0263
See application file for complete search history.

(56) References Cited

U.S. PATENT DOCUMENTS

| | | |
|---|---|---|
| 6,205,239 B1 | 3/2001 | Lin |
| 7,145,976 B2 | 12/2006 | Latreille |
| 8,362,800 B2 | 1/2013 | Or-bach |

(Continued)

*Primary Examiner* — Paul D Kim
(74) *Attorney, Agent, or Firm* — Naval Information Warfare Center Pacific; Kyle Eppele; Euclid B. Woo

(57) ABSTRACT

A space-based circuit-replacing robotic system and method include a satellite grasper configured to grasp the satellite having a printed circuit onto which an integrated circuit is soldered and the integrated circuit is to be replaced; an access mechanism configured to remove the printed circuit and/or to provide access to the printed circuit; a printed circuit orientation device configured to orient a printed circuit such that sunlight is incident on the printed circuit; one or more temperature sensors configured to measure a temperature of the solder on the printed circuit; a processor configured to adjust a rate of heating to match a desired heating rate; a circuit grasping device configured to position the circuit for replacement; and an optical shield that is configured to be adjusted to allow light to pass substantially only to a desired area of the printed circuit.

20 Claims, 2 Drawing Sheets

(56) References Cited

U.S. PATENT DOCUMENTS

| | | |
|---|---|---|
| 9,573,276 B2 | 2/2017 | Stephens, Jr. |
| 9,592,608 B1 * | 3/2017 | Bingham .............. G05B 19/423 |
| 9,707,682 B1 * | 7/2017 | Konolige .............. G06T 19/003 |
| 9,734,448 B2 | 8/2017 | Bolich |
| 2005/0121429 A1 | 6/2005 | Liao |
| 2013/0153710 A1 * | 6/2013 | Roberts ................. B64G 1/402 |
| | | 244/172.5 |
| 2017/0329297 A1 | 11/2017 | Gilman |

* cited by examiner

SPACE-BASED CIRCUIT-REPLACING ROBOTIC SYSTEM

FEDERALLY-SPONSORED RESEARCH AND DEVELOPMENT

The United States Government has ownership rights in this invention. Licensing inquiries may be directed to Office of Research and Technical Applications, Naval Information Warfare Center, Pacific, Code 72120, San Diego, CA, 92152; telephone (619)553-5118; email: ssc_pac_t2@navy.mil. Reference Navy Case No. 104264.

BACKGROUND OF THE INVENTION

Field of Invention

This disclosure relates generally to robotic systems and, more particularly, to space-based robotic systems.

Description of Related Art

Integrated circuits may be critical to the operation of costly satellite systems that are launched into space. Costs associated with these satellite launches may be high. However, the entire satellite mission for each of these satellite systems can be derailed by the failure of a single integrated circuit. Additionally, for satellites with a long mission life, the integrated circuit technology used on the satellite can become obsolete, creating a need for component updates.

In accordance with prior art solutions, spare orbiting satellites can be put into service if one of the main satellites fails. However, building and launching entire additional satellites can be extremely cost prohibitive, especially for large satellites.

There is a need for a method and system for replacing integrated circuits on satellite systems that do not suffer from these shortcomings.

BRIEF SUMMARY OF INVENTION

The present disclosure addresses the needs noted above by providing a space-based circuit repairing robotic system and method. In accordance with one embodiment of the present disclosure, a space-based circuit repairing robotic system is provided. The system comprises a satellite grasper configured to grasp a satellite having a printed circuit that includes a target circuit; an access mechanism configured to remove the printed circuit and/or to provide access to the printed circuit; a printed circuit orientation device configured to orient a printed circuit such that sunlight is incident on the printed circuit; one or more temperature sensors configured to measure a temperature of the printed circuit; a processor configured to adjust a rate of heating to match a desired heating rate; a circuit grasping device configured to position the target circuit for removal or replacement; an optical shield having an adjustable window, the optical shield being configured to be positioned over the printed circuit, the optical shield being further configured to be adjusted to allow light to pass substantially only to a designated area of the printed circuit.

These, as well as other objects, features and benefits will now become clear from a review of the following detailed description, the illustrative embodiments, and the accompanying drawings.

BRIEF DESCRIPTION OF DRAWINGS

The accompanying drawings, which are incorporated in and form a part of the specification, illustrate example embodiments and, together with the description, serve to explain the principles of the system and method for improved contrast enhancement. In the drawings.

DETAILED DESCRIPTION OF THE INVENTION

The present method and system enable the removal of integrated circuits (ICs) from printed circuits and their replacement with another integrated circuit (IC), either for repair or upgrade purposes, on satellite systems in orbit. Since printed circuits are not always on boards, they may be referred to herein simply as printed circuits.

A printed circuit may have various components that reside on the printed circuit, including integrated circuits. The various components may be attached to the printed circuit via soldering to both electrically connect the components to the printed circuit as well as mechanically attach these components to the printed circuit. If an integrated circuit component needs to be replaced, the solder that connects this integrated circuit to the printed circuit may need to be heated to pull off or remove the integrated circuit component. To put a replacement integrated circuit component onto the printed circuit, the solder has to be reheated. Recommended temperature profiles for heating the solder reach around two hundred degrees Celsius (200° C.). As a general rule, non-lead based solder may require a higher heating temperature than lead based solder, e.g., 217° C. versus 183° C.

In accordance with the present system and method, robotics are used for detaching and replacing an integrated circuit from a printed circuit board in the vacuum environment of space. Such robotics are temperature-tolerant, vacuum-tolerant and radiation-tolerant, among other things.

Figure 1:
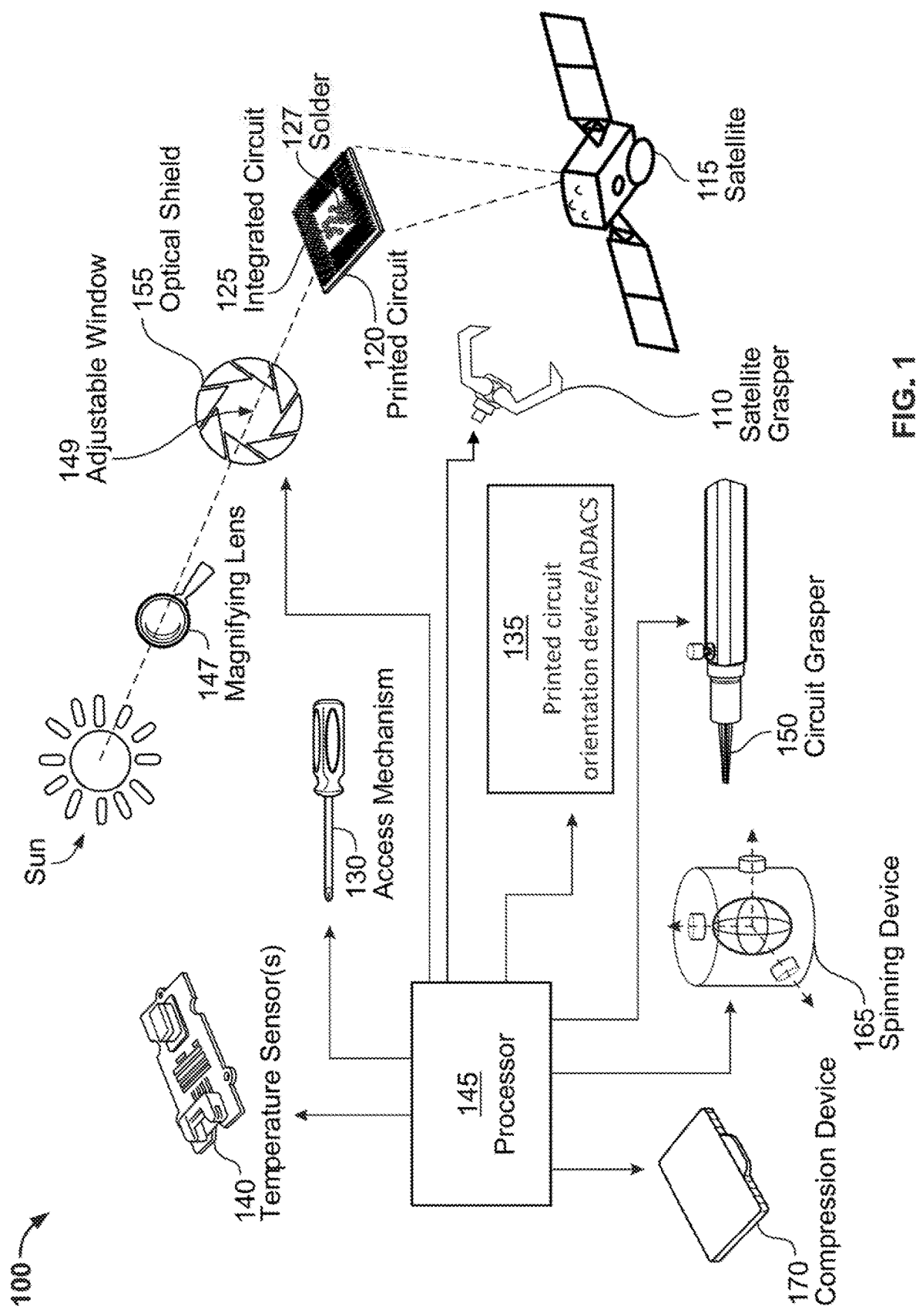
FIG. 1 illustrates a space-based circuit-repairing robotic system in accordance with one embodiment of the present disclosure.

FIG. 1 illustrates a space-based circuit-replacing robotic system in accordance with one embodiment of the present disclosure. The space-based circuit replacing robotic system includes a satellite grasper 110. The satellite grasper 110 is configured to grasp the satellite 115 having a printed circuit 120 onto which a target circuit 125 is attached via solder 127 and the target circuit 125 is to be replaced. As shown in the present illustration, the satellite grasper 110 may be similar to a pair of tongs or claws or holding apparatuses that can grasp the satellite 115 so that the target circuit 125 may be replaced. However, the satellite grasper may also be a separate satellite with a robotic arm (not shown) that extends to grasp satellite 115 so that target circuit 125 on the satellite 115 may be replaced. Target circuit 125 is an integrated circuit that has been identified for replacement.

An access mechanism 130 is configured to remove the printed circuit 120 and/or to provide access to the printed circuit 120. The access mechanism 130 may be, e.g., screwdrivers, graspers, pliers, etc.

A printed circuit orientation device 135 is configured to orient printed circuit 120 such that sunlight is incident on the printed circuit 120. The printed circuit orientation device 135 may be an attitude determination and control system (ADACS) that is already supplied with the satellite 115. Otherwise, the printed circuit orientation device 135 may be, e.g., a robotic arm with another grasper, that positions the printed circuit 120 so that the solder 127 may be heated and/or melted. The system 100 also includes one or more temperature sensors 140 configured to measure a temperature of the printed circuit 120.

A processor 145 is configured to adjust a rate of heating to match a desired heating rate. The processor 145 is further configured to adjust the rate of heating on the printed circuit 120 to match the desired heating rate by closing of the adjustable window 149 or covering the opening of the adjustable window 149 with a separate cover. Alternatively, the processor 145 is further configured to adjust the rate of heating to match the desired heating rate by one or more of three mechanisms as follows: a) adjusting the distance between the magnifying lens 147 and the printed circuit 120 so as to adjust the intensity of magnified sunlight incident on the printed circuit 120; b) duty-cycling the magnification via rotation of the magnifying lens 147 (for example to be orthogonal to the printed circuit 120 rather than parallel when attempting to reduce heating rate); and/or c. duty-cycling the magnification via closing of the adjustable window 149 or covering the opening of the adjustable window 149 with a separate cover.

A circuit grasping device 150 is configured to position the target circuit 125 for replacement. The circuit grasping device 150 may be made of any material suitable for space-based use. As would be understood by a person of ordinary skill in the art, the material would need to be vacuum-tolerant and pressure-tolerant, among other things.

The space-based circuit-replacing robotic system 100 may also include an optical shield 155 having an adjustable window 149. The optical shield 155 is configured to be positioned over the printed circuit 120. The optical shield 155 is also configured to be adjusted to allow sunlight to pass substantially only to a desired area of the printed circuit 120 that contains the target circuit 125 to be replaced.

A magnifying lens 147 may be placed between the adjustable window 149 and sunlight. A spinning device 165 may be used to hold other printed circuit 120 components down substantially in place while heating up the solder on the target circuit 125 to be replaced. The spinning device 165 is also configured to spin at a substantially consistent speed that creates a constant force on components of printed circuit 120 that are not to be replaced. The spinning device 165 may use centripetal force and effectively makes a single force vector to hold the components of printed circuit 120 in place that are not to be replaced.

The space-based circuit-replacing robotic system 100 may also include a compression device 170 configured to hold down other components on the printed circuit 120 so that they don't float off or detach from the printed circuit 120 when heating is applied to target circuit 125.

The processor 145 may be operably coupled to some or all of the remaining elements of the space-based circuit-replacing robotic system 100. For example, the processor 145 may be operably coupled to the access mechanism 130, the printed circuit orientation device 135 (which may be an ADACS, as described above), the temperature sensors 140, the adjustable window 149, the circuit grasping device 150, the spinning device 165 and the compression device 170 so that the processor 145 can control the various elements to which it is operably coupled via software instructions.

Figure 2:
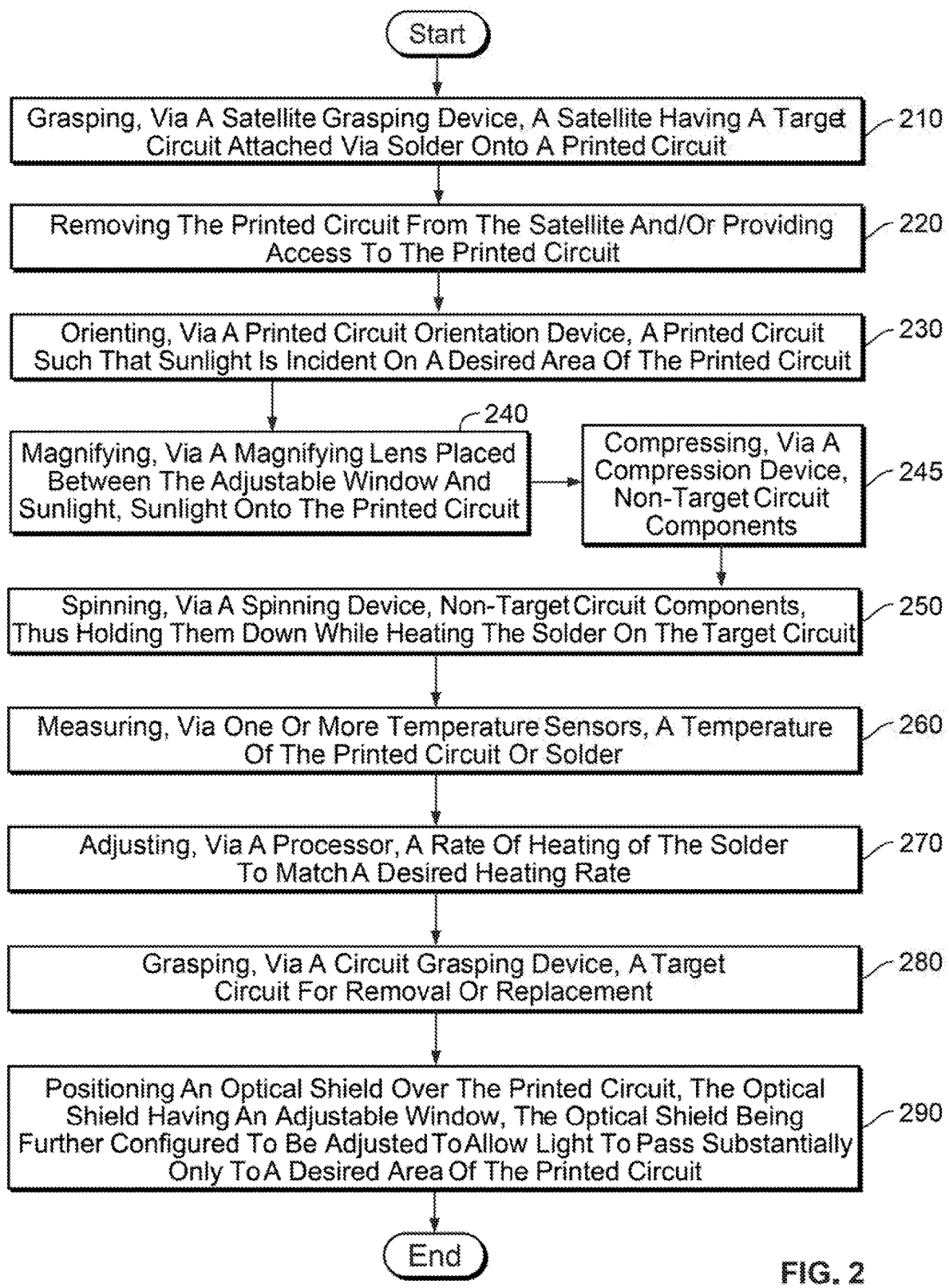
FIG. 2 illustrates a method for space-based circuit replacement in accordance with one embodiment of the present disclosure.

Referring now to FIG. 2, a robotic method for space-based circuit-replacement is illustrated. The method includes steps performed by the robotic system (via a remote human operator and/or automatic systems) when the satellite has access to sunlight. First, the robotic system rendezvouses with the satellite to be replaced.

At step 210, the robotic system grasps, via a satellite grasping device, a satellite having a printed circuit onto which an integrated circuit is soldered and the integrated circuit is to be replaced. The robotic system may include, for example, a separate satellite with a robotic arm for this purpose.

At step 220, the method includes removing the printed circuit from the satellite and/or providing access to the printed circuit. In this step, the printed circuit being modified and the integrated or target circuit are removed from the satellite or at least exposed for access by the robotic system. This is effected by the use of appropriate tools (screw drivers, graspers, etc.) by the robotic system.

At step 230, the method includes orienting, via printed circuit orientation device, a printed circuit or integrated circuit such that sunlight is incident on the side where the printed circuit resides. The printed circuit may be oriented at an angle close to ninety (90) degrees from the plane of the printed circuit. This orientation is effected either by robotic manipulation of the printed circuit, adjustment of the orientation of the robotic system, or by reorienting the satellite (if the printed circuit is merely exposed but not removed from the satellite) via control from the ground or manipulation by the robotic system where possible.

At step 240, the method includes magnifying the sunlight, via a magnifying lens that is placed between the adjustable window and the sun. The magnifying lens is placed at such height as it will provide focused sunlight onto the entire area to be heated.

At step 245, the method includes compressing, via a compression device, non-target circuit components. The compression device holds down the non-target components on the printed circuit so that they don't float off or detach from the printed circuit when heat is applied to the circuit. This gentle compression is applied to non-target components on the printed circuit that are near the target circuit to ensure that the quality of their bonds to the printed circuit are not negatively affected during the heating process.

At step 250, the method includes spinning, via a spinning device, non-target IC components so that non-target IC components are held down while heating up circuit. The non-target components are spun at a substantially consistent speed that creates a constant force on object e.g. centripetal force and effectively a single force vector.

At step 260, the method includes measuring, via one or more temperature sensors, a temperature of the printed circuit, e.g. via an infrared temperature sensor.

At step 270, the method includes adjusting, via a processor, a rate of heating to match a desired heating rate. The measurements from the temperature sensor(s) is/are fed into a control loop that adjusts the rate of heating to match a desired heating rate by one or more of the following mechanisms: (a) Adjusting the distance between the magnifying lens and the printed circuit so as to adjust the intensity of magnified sunlight incident on the integrated circuit; (b) Duty-cycling the magnification via rotation of the lens (for example by rotating the lens to be orthogonal to the printed circuit rather than parallel when attempting to reduce a heating rate), or (c) Duty-cycling solar loading on the printed circuit of the adjustable window or covering the opening of the adjustable window with a separate cover. As used herein, solar loading is the amount of sunlight to which an object is exposed over a period of time.

When the temperature is measured to be in the temperature range at which the solder that bonds the integrated circuit to the printed circuit is liquid, the integrated or target circuit is pulled off of the printed circuit by the small grasper that has been grasping it and stored/disposed of in an appropriate manner.

At step 280, the method includes grasping, via a circuit grasping device, a target circuit to be replaced. In this connection, a small grasper may grasp the integrated circuit from two or more of its edges.

At step 290, the method includes positioning an optical shield over the circuit. The optical shield may have an adjustable window or aperture. The optical shield is configured to be adjusted to allow light to pass substantially only to an area of, or pertaining to, the target circuit or other area intended to be directly heated. The temperature is controlled as above to reduce the temperature at the appropriate rate and/or by completely covering the printed circuit from light and/or attaching heat sinks to the printed circuit so as to cool the printed circuit at the desired rate. It should also be noted that this step 290 may be performed earlier in the repair process. For example, this step where the optical shield is positioned may occur after the printed circuit is oriented in step 230.

Once the printed circuit has cooled to an appropriate temperature (close to that of the replacement integrated circuit), at step 265, the replacement integrated circuit may be positioned in the place of the original IC that was removed. The small grasper may grasp the replacement integrated circuit and place it into the position and orientation originally occupied by the removed integrated circuit.

The small grasper then applies and holds a gentle force (roughly equal the equivalent force of earth gravity if the part were sitting on the printed circuit on earth) pushing the replacement circuit against the printed circuit.

The temperature is controlled as it was for the removal of the integrated circuit except that the grasper does not lift the replacement integrated circuit but rather continues to provide a gentle force on the integrated circuit toward the printed circuit. The profile of temperature versus time may be different from that used for the removal step.

The temperature is controlled to effect the cooling of the printed circuit at the desired rate as it was after the removal of the original integrated circuit. Once the printed circuit is sufficiently cool that the integrated circuit is bonded securely to the printed circuit, the grasper releases the integrated circuit. As applicable, the printed circuit is replaced and reconnected into the satellite mechanically and electrically. As applicable, the printed circuit is closed up on the satellite using similar tools as those used to open it and remove the printed circuit. The profile of temperature versus time may be different from that used for the removal step.

The foregoing description of various embodiments has been presented for purposes of illustration and description. It is not intended to be exhaustive or to limit the invention to the precise forms disclosed, and obviously many modifications and variations are possible in light of the above teaching. The example embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the method and system be defined by the claims appended hereto.

What is claimed:

1. A system, comprising:
   a satellite grasper configured to grasp a satellite having a target circuit attached via solder onto a printed circuit;
   an access mechanism configured to remove the printed circuit and/or to provide access to the printed circuit;
   a printed circuit orientation device configured to orient the printed circuit such that a sunlight is incident on the printed circuit;
   one or more temperature sensors configured to measure a temperature of the printed circuit;
   a processor configured to adjust a rate of heating for the solder to match a desired heating rate;
   a circuit grasping device configured to position the target circuit for removal and/or replacement; and
   an optical shield having an adjustable window, the optical shield being configured to be positioned over the printed circuit, the optical shield being further configured to be adjusted to allow the sunlight to pass substantially only to a designated area of the printed circuit.

2. The system of claim 1, further comprising:
   a magnifying lens disposed between the adjustable window and the sunlight.

3. The system of claim 1, further comprising:
   a spinning device that holds non-target circuit components down while heating up the solder that attaches the target circuit onto the printed circuit.

4. The system of claim 1, further comprising:
   a compression device configured to hold down non-target circuit components on the printed circuit to prevent the non-target circuit components from detaching from the printed circuit.

5. The system of claim 2, wherein the processor is further configured to adjust the rate of heating to match the desired heating rate by duty-cycling solar loading via closing of the adjustable window or covering an opening of the adjustable window with a separate cover.

6. The system of claim 2, wherein the processor is further configured to adjust the rate of heating for the solder to match the desired heating rate by adjusting a distance between the magnifying lens and the printed circuit so as to adjust an intensity of magnified sunlight incident on the printed circuit.

7. The system of claim 2, wherein the processor is further configured to adjust the rate of heating for the solder to match the desired heating rate by duty-cycling a magnification via rotation of the lens.

8. A method, comprising:
   grasping, via a satellite grasping device, a satellite having a target circuit attached via solder onto a printed circuit;
   removing the printed circuit from the satellite and/or providing access to the printed circuit;
   orienting, via a printed circuit orientation device, the printed circuit such that a sunlight is incident on a desired area of the printed circuit;
   measuring, via one or more temperature sensors, a temperature of the printed circuit or solder;
   adjusting, via a processor, a rate of heating of the solder to match a desired heating rate;
   grasping, via a circuit grasping device, the target circuit for removal or replacement; and
   positioning an optical shield over the printed circuit, the optical shield having an adjustable window, the optical shield being further configured to be adjusted to allow the sunlight to pass substantially only to a desired area of the printed circuit.

9. The method of claim 8, further comprising:
   magnifying, via a magnifying lens placed between the adjustable window and the sunlight, the sunlight onto the printed circuit.

10. The method of claim 8, further comprising:
spinning, via a spinning device, non-target circuit components, thus holding the non-target circuit components down while heating the solder on the target circuit.

11. The method of claim 8, further comprising:
compressing, via a compression device, non-target circuit components on the printed circuit, the compression device being configured to hold down the non-target circuit components on the printed circuit to prevent the non-target circuit components from detaching from the printed circuit.

12. The method of claim 9, further comprising:
adjusting, via the processor, the rate of heating to match the desired heating rate by duty-cycling solar loading on the printed circuit via closing of the adjustable window or covering an opening of the adjustable window with a separate cover.

13. The method of claim 9, wherein the adjusting step comprises adjusting a rate of heating to match the desired heating rate by duty-cycling a magnification via rotation of the lens.

14. The method of claim 9, wherein the adjusting step comprises adjusting the rate of heating to match the desired heating rate by duty-cycling a magnification via closing the adjustable window or covering an opening of the adjustable window with a separate cover.

15. A system, comprising:
a satellite grasper configured to grasp a satellite having a target circuit attached via solder onto a printed circuit;
an access mechanism configured to remove the printed circuit and/or to provide access to the printed circuit;
a printed circuit orientation device configured to orient the printed circuit such that a sunlight is incident on the printed circuit;
one or more temperature sensors configured to measure a temperature of the printed circuit;
a processor configured to adjust a rate of heating for the solder to match a desired heating rate;
a circuit grasping device configured to position the target circuit for removal and/or replacement;
an optical shield having an adjustable window, the optical shield being configured to be positioned over the printed circuit, the optical shield being further configured to be adjusted to allow the sunlight to pass substantially only to a designated area of the printed circuit; and
a magnifying lens disposed between the adjustable window and the sunlight.

16. The system of claim 15, further comprising:
a spinning device that holds non-target circuit components down while heating up the solder that attaches the target circuit onto the printed circuit.

17. The system of claim 15, wherein the processor is further configured to adjust the rate of heating to match the desired heating rate by duty-cycling solar loading on the printed circuit via closing of the adjustable window or covering an opening of the adjustable window with a separate cover.

18. The system of claim 15, wherein the processor is further configured to adjust the rate of heating for the solder to match the desired heating rate by adjusting a distance between the magnifying lens and the printed circuit so as to adjust the intensity of magnified sunlight incident on the printed circuit.

19. The system of claim 15, wherein the processor is further configured to adjust the rate of heating for the solder to match the desired heating rate by duty-cycling a magnification via rotation of the lens.

20. The system of claim 15, further comprising:
a compression device configured to hold down non-target circuit components on the printed circuit to prevent the non-target circuit components from detaching from the printed circuit.

* * * * *